United States Patent [19]
Inoue et al.

[11] Patent Number: 5,966,944
[45] Date of Patent: Oct. 19, 1999

[54] SUPERCONDUCTING MAGNET SYSTEM OUTFITTED WITH COOLING APPARATUS

[75] Inventors: Tatsuo Inoue, Anjo; Yoshimasa Ohashi, Toyota, both of Japan

[73] Assignee: Aisin Seiki Kabushiki Kaisha, Kariya, Japan

[21] Appl. No.: 09/057,579

[22] Filed: Apr. 9, 1998

[51] Int. Cl.$^6$ .................................................. F25B 19/00
[52] U.S. Cl. .................................................. 62/51.1; 62/6
[58] Field of Search ........................................ 62/6, 51.1

[56] References Cited

U.S. PATENT DOCUMENTS

| | | | |
|---|---|---|---|
| 5,381,666 | 1/1995 | Saho et al. | 62/51.1 |
| 5,515,685 | 5/1996 | Yanai et al. | 62/6 |
| 5,551,243 | 9/1996 | Palkovich et al. | 62/51.1 |
| 5,647,218 | 7/1997 | Kuriyama et al. | 62/51.1 |

FOREIGN PATENT DOCUMENTS

| | | |
|---|---|---|
| 6-109359 | 4/1994 | Japan . |
| 7-72650 | 8/1995 | Japan . |
| 8-327171 | 12/1996 | Japan . |

*Primary Examiner*—Ronald Capossela
*Attorney, Agent, or Firm*—Burns, Doane, Swecker & Mathis, LLP

[57] ABSTRACT

A superconducting magnet system, such as an NMR apparatus, is outfitted with a compact-size refrigerator that prevents mechanical vibrations produced by the refrigerator from being transmitted to the superconducting magnet system. The refrigerator is in the form of a pulse tube refrigerator having a cold head and a pressure oscillation generating source. The cold head of the pulse tube refrigerator is connected directly to a vacuum insulation vessel of the superconducting magnet system. Cold generated from the cold head cools a cooling device, for example, a liquid helium tank for cooling the superconducting coil, or a heat penetration reducing device, for example, a liquid nitrogen tank, for reducing heat penetration from outside.

18 Claims, 7 Drawing Sheets

SUPERCONDUCTING MAGNET SYSTEM OUTFITTED WITH COOLING APPARATUS

This application corresponds to and claims priority under 35 U.S.C. § 119 with respect to Japanese Patent Application No. HEI 9-91096 filed on Apr. 9, 1997, the entire content of which is incorporated herein by reference.

FIELD OF THE INVENTION

The present invention generally relates to a cooling apparatus. More particularly, the present invention pertains to a superconducting magnet system such as a physicochemical appliance (e.g., nuclear magnetic resonance (NMR) appliance) provided with a cooling apparatus.

BACKGROUND OF THE INVENTION

In physicochemical appliances, for example, nuclear magnetic resonance (NMR) appliances, that use a superconducting magnet to create a uniform magnetic field and measure physical and chemical characteristics of a substance in the magnetic field, liquid helium is conventionally used as a cryogen to cool the superconducting magnet (to about −270° C.). The liquid helium is stored in a liquid helium storage tank that is surrounded by a liquid nitrogen storage tank to reduce heat penetration into the liquid helium storage tank and reduce evaporation of the liquid helium.

Such physicochemical appliances are susceptible of certain disadvantages and drawbacks in that they consume significant amounts of liquid nitrogen as compared with the consumption of liquid helium, thereby requiring much expense in time and labor for replenishment of the liquid nitrogen. Japanese Patent Application Laid-Open No. Hei 8-327171 proposes a solution in an attempt to address this problem. The system described in this document is illustrated in FIG. 9.

As seen in FIG. 9, a vacuum insulation vessel 51 of an NMR apparatus contains a liquid helium storage tank 53 filled with liquid helium. A superconducting magnet 52 is located in the liquid helium in the liquid helium storage tank 53. Surrounding the outer periphery of the liquid helium storage tank 53 is a liquid nitrogen storage tank 54 filled with liquid nitrogen.

A re-liquefaction vessel 55 includes a vacuum insulation structure in which a re-liquefied gas pool portion 56 is formed. A cryogenic refrigerator is mainly made up of a cold head 58 and a compressor 59. A low temperature generating portion 60 of the cold head 58 protrudes toward or into the re-liquefied gas pool portion 56.

The vacuum insulation vessel 51 is connected to the re-liquefaction vessel 55 by a flexible pipe 61. The liquid nitrogen storage tank 54 of the vacuum insulation vessel 51 thus communicates with the re-liquefied gas pool portion 56 of the re-liquefaction vessel 55.

In this construction, nitrogen gas formed in the liquid nitrogen storage tank 54 of the vacuum insulation vessel 51 is conveyed by the flexible pipe 61 into the re-liquefaction vessel 55. In the re-liquefaction vessel 55, nitrogen gas is re-liquefied by the low temperature generating unit 60 of the cryogenic refrigerator, and re-liquefied gas (liquid nitrogen) is pooled in the re-liquefied gas pool portion 56 formed in the lower portion of the re-liquefaction vessel 55. Overflow of the re-liquefied gas (liquid nitrogen) from the re-liquefied gas pool portion 56 flows down through the flexible pipe 61 and thus returns to the liquid nitrogen storage tank 54. Therefore, the consumption of liquefied gas is reduced and the time period for liquefied gas replenishment is lengthened.

In this conventional technology, however, the cooling system for cooling and re-liquefying the nitrogen produces significant mechanical vibrations. Thus, the NMR apparatus and the re-liquefaction vessel are disposed apart from each other, with the flexible pipe connecting the two, in order to prevent mechanical vibrations produced by the refrigerator from being transmitted to the NMR apparatus. In this way, reductions in the measurement precision of the NMR apparatus can be prevented. Unfortunately, this results in a rather complicated construction having a relatively large size.

In light of the foregoing, a need exists for a superconducting magnet system which is able to effectively cool the superconducting magnet, yet which is relatively compact in size and does not require the same complicated construction as other known systems.

SUMMARY OF THE INVENTION

According to a first aspect of the invention, a superconducting magnet system includes a vacuum insulation vessel, a superconducting magnet disposed in the vacuum insulation vessel, and a cooling device for cooling the superconducting magnet. The cooling apparatus includes a pulse tube refrigerator having a pressure oscillation generating source and a low temperature generating unit that is connected to the vacuum insulation vessel. The low temperature generating unit is provided with a cold head that generates cold for cooling the cooling device.

In this aspect of the invention, the low temperature generating unit of the pulse tube refrigerator is connected to and directly mounted on the vacuum insulation vessel of the superconducting magnet device that measures characteristics of a substance in a magnetic field generated by the superconducting magnet. Cold generated from the cold head of the low temperature generating unit cools the cooling device (e.g., liquid helium) for cooling the superconducting magnet. Therefore, the cooling device is directly cooled inside the superconducting magnet device.

Pulse tube refrigerators produce less vibrations in the cold head of the low temperature generating unit than Stirling coolers and Gifford-McMahon coolers. Therefore, although the low temperature generating unit of the pulse tube refrigerator is directly connected to the superconducting magnet device, little or no vibrations are transmitted to the superconducting magnet device. As a result, the need to provide a re-liquefaction device outside the superconducting magnet apparatus is eliminated, thereby allowing a compact design of the entire system.

According to a second aspect of the invention, a superconducting magnet system includes a vacuum insulation vessel, a superconducting magnet disposed in the vacuum insulation vessel, a cooling device for cooling the superconducting magnet, and a heat penetration reducing device for reducing heat penetration from outside the vacuum insulation vessel. A cooling apparatus is also provided and includes a pulse tube refrigerator having a pressure oscillation generating source and a low temperature generating unit that is connected to the vacuum insulation vessel of the superconducting magnet system. The low temperature generating unit includes a cold head that generates cold for cooling the heat penetration reducing device.

According to this aspect of the invention, the low temperature generating unit of the pulse tube refrigerator is connected to the vacuum insulation vessel of the superconducting magnet device that measures a characteristic of a substance in a magnetic field generated by the superconducting magnet. Cold generated from the cold head of the low temperature generating unit cools the heat penetration reducing device for reducing heat penetration from outside the vacuum insulation vessel.

In a typical superconducting magnet system, such as an NMR apparatus, a superconducting coil formed by winding a superconductor wire or the like is disposed in, for example, a liquid helium storage tank containing liquid helium. The liquid helium storage tank is surrounded by the heat penetration reducing device. The heat penetration reducing device may be, for example, a liquid coolant storage tank containing a liquid coolant such as liquid nitrogen or a radiation shield plate formed of aluminum or another type of material. The heat penetration reducing device performs the function of reducing heat penetration from outside the superconducting magnet device. In this aspect of the invention, the low temperature generating unit of the pulse tube refrigerator cools the heat penetration reducing device in the form of a liquid coolant storage tank, a radiation heat shield plate or other similar device.

With this construction, the cooling apparatus of the present invention eliminates the need for providing a re-liquefaction device for liquid coolant or the like, outside the superconducting magnet device, thereby allowing a compact design of the entire apparatus. Furthermore, because the pulse tube refrigerator does not produce strong vibrations, little or no vibrations are transmitted from the pulse tube refrigerator to the superconducting magnet device, thereby allowing the superconducting magnet device to perform high-precision measurement. Further, because the cooling apparatus according to the present invention cools the heat penetration reducing device, such as liquid nitrogen or the like, which has a higher temperature than liquid helium, a sufficient refrigerating effect can be achieved even if the refrigerating capacity of the pulse tube refrigerator is relatively low. Therefore, it is possible to use a relatively simply constructed pulse tube refrigerator and thereby reduce the production cost.

Another aspect of the present invention involves a superconducting magnet system having a vacuum insulation vessel and a superconducting magnet disposed in the vacuum insulation vessel. A cooling apparatus is also provided and includes a pulse tube refrigerator having a pressure oscillation generating source and a low temperature generating unit that is connected to the vacuum insulation vessel. The low temperature generating unit has a cold head that generates cold for cooling the superconducting magnet.

The low temperature generating unit of the pulse tube refrigerator is directly connected to the vacuum insulation vessel of the superconducting magnet device that measures a characteristic of a substance in a magnetic field generated by the superconducting magnet. Cold generated from the cold head of the low temperature generating unit cools the superconducting magnet. That is, in this aspect of the present invention, the cooling medium, such as liquid helium, liquid nitrogen or the like, is omitted and the superconducting magnet is directly cooled by the pulse tube refrigerator.

With this construction, it is possible to omit a re-liquefaction device for a liquid coolant and to further omit the use of a coolant, such as liquid helium, for directly cooling the superconducting magnet. Therefore, the apparatus construction can be made highly compact. Because the pulse tube refrigerator does not produce strong vibrations, the superconducting magnet device is allowed to perform high-precision measurement.

In the cooling apparatus used in the superconducting magnet system according to the present invention, the pressure oscillation generating source and the low temperature generating unit may be disposed apart from each other and interconnected by a connecting pipe. If the pressure oscillation generating source and the low temperature generating unit of the pulse tube refrigerator are disposed apart from each other, the transmission of slight vibrations produced by the pressure oscillation generating source to the cold head of the low temperature generating unit can be substantially prevented. Therefore, the superconducting magnet device can perform higher precision measurement.

Furthermore, the heat penetration reducing device can be a liquid coolant, and the low temperature generating unit of the pulse tube refrigerator can protrude into a liquid coolant storage tank containing the fluid liquid. With this construction, the liquid coolant is cooled by cold generated from the cold head of the low temperature generating unit. In the event evaporation of the liquid coolant occurs, it is immediately re-liquefied by cold generated from the cold head. Therefore, replenishment of the liquid coolant can be considerably reduced.

The cold head of the pulse tube refrigerator can be positioned in contact with the heat penetration reducing device. In this construction, because the cold head of the low temperature generating unit of the pulse tube refrigerator is in contact with the heat penetration reducing device (for example, a liquid nitrogen storage tank containing liquid nitrogen), it is possible to cool the liquid coolant, such as liquid nitrogen, to the boiling point of the liquid coolant or lower. Therefore, the heat penetration from outside can be more efficiently reduced and evaporation of the liquid coolant can be considerably reduced.

The connecting pipe between the low temperature generating unit and the pressure oscillation generating source can be a flexible pipe. With the low temperature generating unit and the pressure oscillation generating source of the pulse tube refrigerator being disposed apart from each other and interconnected by a flexible pipe, the transmission of slight vibrations produced by the pressure oscillation generating source to the low temperature generating unit can be more reliably prevented. Therefore, the measurement precision of the superconducting magnet device is improved.

The pressure oscillation generating source can be provided with a construction that reduces transmission of vibrations. If the pressure oscillation generating source is provided with a construction that reduces transmission of vibrations, the transmission of slight vibrations produced from the pressure oscillation generating source to the low temperature generating unit will be more reliably prevented. Therefore, the measurement precision of the superconducting magnet system is further improved.

The low temperature generating unit of the pulse pipe refrigerator can be provided with a construction that reduces transmission of vibrations. The provision of a vibration reducing construction for the low temperature generating unit substantially eliminates the possibility that vibrations will be transmitted to the superconducting magnet if vibrations from the pressure oscillation generating source are transmitted to the low temperature generating unit. Therefore, the measurement precision of the superconducting magnet device is further improved.

BRIEF DESCRIPTION OF THE DRAWINGS FIGURES

The foregoing and additional features and advantages of the present invention will become more apparent from the following detailed description considered with reference to the accompanying drawing figures in which like reference numerals designate like elements and wherein.

DETAILED DESCRIPTION OF PREFERRED EMBODIMENTS

Figure 1:
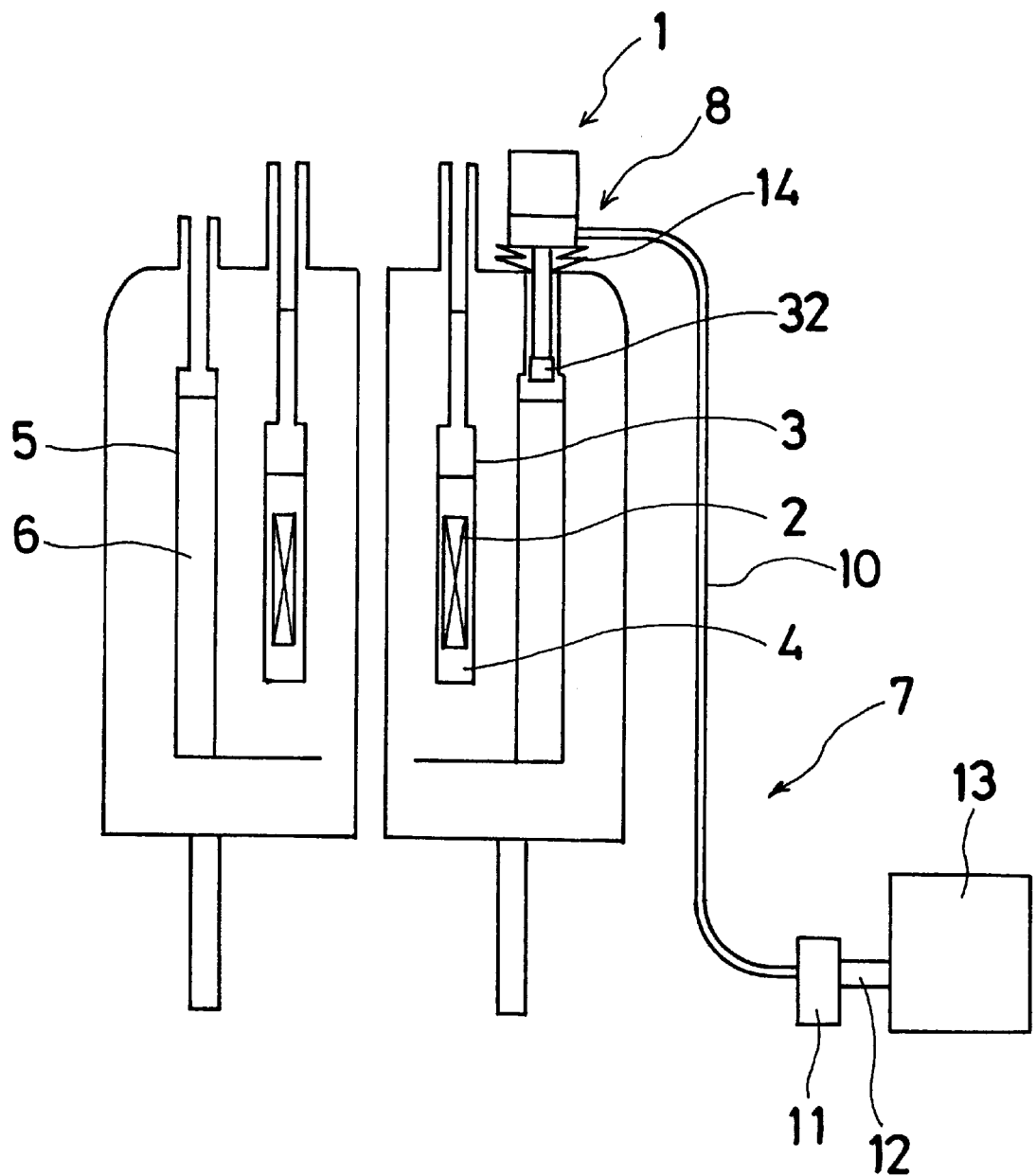
FIG. 1 is a schematic illustration of a superconducting magnet device outfitted with a cooling apparatus according to a first embodiment of the present invention.

FIG. 1 is a schematic diagram of a superconducting magnet system according to a first embodiment of the present invention in which a superconducting magnet device is outfitted with a cooling device. Referring to FIG. 1, a vacuum insulation vessel 1 of a nuclear magnetic resonance (NMR) apparatus, that is, a superconducting magnet device, contains a superconducting coil 2 forming a superconducting magnet. The superconducting coil 2 is a coil formed by winding a wire of a NbTi-based or $Nb_3Se$-based material or the like. The superconducting coil 2 is housed in a liquid helium storage tank 3 having an annular cylindrical shape. The liquid helium storage tank 3 contains liquid helium 4 so that the coil 2 is submerged in the liquid helium.

Surrounding the outer periphery of the liquid helium storage tank 3 is a liquid nitrogen storage tank 5 that also has an annular cylindrical shape. The liquid nitrogen storage tank 5, which contains liquid nitrogen 6, is designed to cool the liquid helium storage tank 3 to reduce penetration of heat from the exterior and therefore reduce evaporation of the liquid helium 4. Thus, the liquid nitrogen 6 serves as a heat penetration reducing device.

The cooling apparatus is in the form of a pulse tube refrigerator that is operatively connected to the NMR apparatus. The pulse tube refrigerator 7 includes a low temperature generating unit 8 that is inserted into the liquid helium storage tank 3 from the upper surface of the storage tank 3 as seen in FIG. 1. The lower end portion of the low temperature generating unit 8 that is formed by a cold head 32, a cold accumulator and a pulse tube protrudes into the liquid helium storage tank 3. The low temperature generating unit 8 is connected to one end of a flexible pipe 10. The other end of the flexible pipe 10 is connected to a valve unit 11. The valve unit 11 is connected to a compressor unit 13 by a flexible pipe 12. A vibration absorbing mechanism which can be in the form of a bellows 14 is disposed between the low temperature generating unit 8 and the upper surface of the vacuum insulation vessel 1 for absorbing vibrations.

The valve unit 11 and the compressor unit 13 constitute a pressure oscillation generating source that oscillates the pressure of an operating fluid in the pulse tube refrigerator 7. The pulse tube refrigerator 7 is separated into the low temperature generating unit 8, including the cold head 32, the cold accumulator and the pulse tube, and the pressure oscillation generating source formed by the valve unit 11 and the compressor unit 13. The low temperature generating unit 8 and the pressure oscillation generating source are interconnected to one another by way of the valve unit 11.

Figure 6:
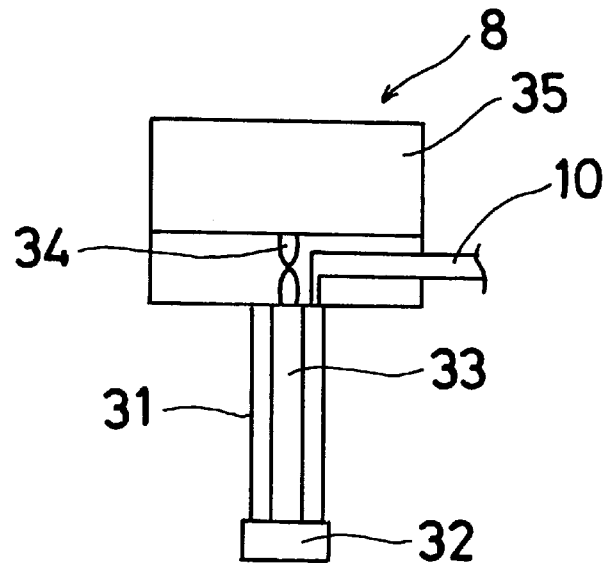
FIG. 6 illustrates a specific construction of a low temperature generating unit of the pulse tube refrigerator used in the first embodiment of the present invention.

Additional details relating to the construction of the low temperature generating unit 8 are shown in FIG. 6. The low temperature generating unit 8 is comprised primarily of an annular shaped cold accumulator 31 communicating with one end of the flexible pipe 10, the cold head 32 communicating with the lower end portion of the cold accumulator 31 (that is, a low temperature end portion), a hollow cylindrical pulse tube 33 located radially inwardly of the cold accumulator 31 and communicating with the cold head 32, and a buffer tank 35 communicating with the upper end portion (normal temperature portion) of the pulse tube 33 through an orifice 34.

The valve unit 11 is formed by, for example, a rotary valve and operates to change the pressure of the operating fluid to be supplied to the low temperature generating unit 8 between a high pressure and a low pressure. The compressor unit 13 includes a high pressure ejection port and a low pressure suction port that separately communicate with the valve unit 11.

The operation of the pulse tube refrigerator 7 is as follows. When the valve unit 11 is driven so that the high pressure ejection port of the compressor unit 13 communicates with the flexible pipe 10, the low temperature generating unit 8 becomes a high pressure state. Subsequently, the low pressure suction port of the compressor unit 13 is put in communication with the flexible pipe 10 by the valve unit 11 so that the low temperature generating unit 8 becomes a low pressure state. In this manner, the pressure state of the low temperature generating unit 8 is alternately changed between the high pressure state and the low pressure state.

Along with the pressure oscillations, the operating fluid in the low temperature generating unit 8 flows into and out of the buffer tank 35 that is at an intermediate pressure, thus undergoing positional oscillations. However, the orifice 34 causes a phase difference between the pressure oscillations and the positional oscillations, whereby a portion of the operating fluid near the cold head 32 is expanded and takes up heat. Heat is progressively passed to the normal temperature side of the cold accumulator 31 (the upper end side in FIG. 6). Therefore, the cold head 32 and a surrounding portion are deprived of heat and therefore cooled, thereby generating very low temperatures.

Because it is necessary to always maintain the superconducting coil 2 at a superconduction transition temperature or lower, the superconducting coil 2 must constantly be cooled. Thus, the superconducting coil 2 is submerged in the liquid helium 4. To reduce heat penetration from outside and therefore reduce evaporation of the liquid helium 4, the liquid nitrogen storage tank 5, containing liquid nitrogen 6, is disposed in surrounding relation to the outer periphery of the liquid helium storage tank 3. Because liquid nitrogen exists at relatively low temperatures (that is, at −196° C. or lower), evaporation of the liquid nitrogen needs to be minimized. Further, to the extent evaporation of the liquid nitrogen occurs, the evaporated nitrogen needs to be re-liquefied. To address this, in accordance with the present invention, the low temperature generating unit 8 of the pulse tube refrigerator 7 is directly connected to the liquid nitrogen storage tank 5 so that the lower end portion of the low temperature generating unit 8 formed by the cold head 32, the cold accumulator 31 and the pulse tube 33 protrudes into the liquid nitrogen storage tank S. This construction minimizes the evaporation of the liquid nitrogen 6 and, if any evaporation occurs, immediately re-liquefies the evaporated nitrogen by cold generated by the cold head 32.

In this embodiment, because the low temperature generating unit 8 of the pulse tube refrigerator 7 is directly connected to the vacuum insulation vessel 1 of the superconducting magnet device, such as an NMR apparatus, the need to provide a re-liquefaction device outside the device is eliminated. This allows the overall construction of the entire apparatus to be made more compact. Furthermore, because the pulse tube refrigerator is used for cooling the liquid nitrogen and reducing the evaporation thereof (or effecting re-liquefaction), substantially no vibrations are transmitted to the superconducting magnet device. This means that high-precision measurements by the superconducting magnet device are not adversely affected.

Figure 2:
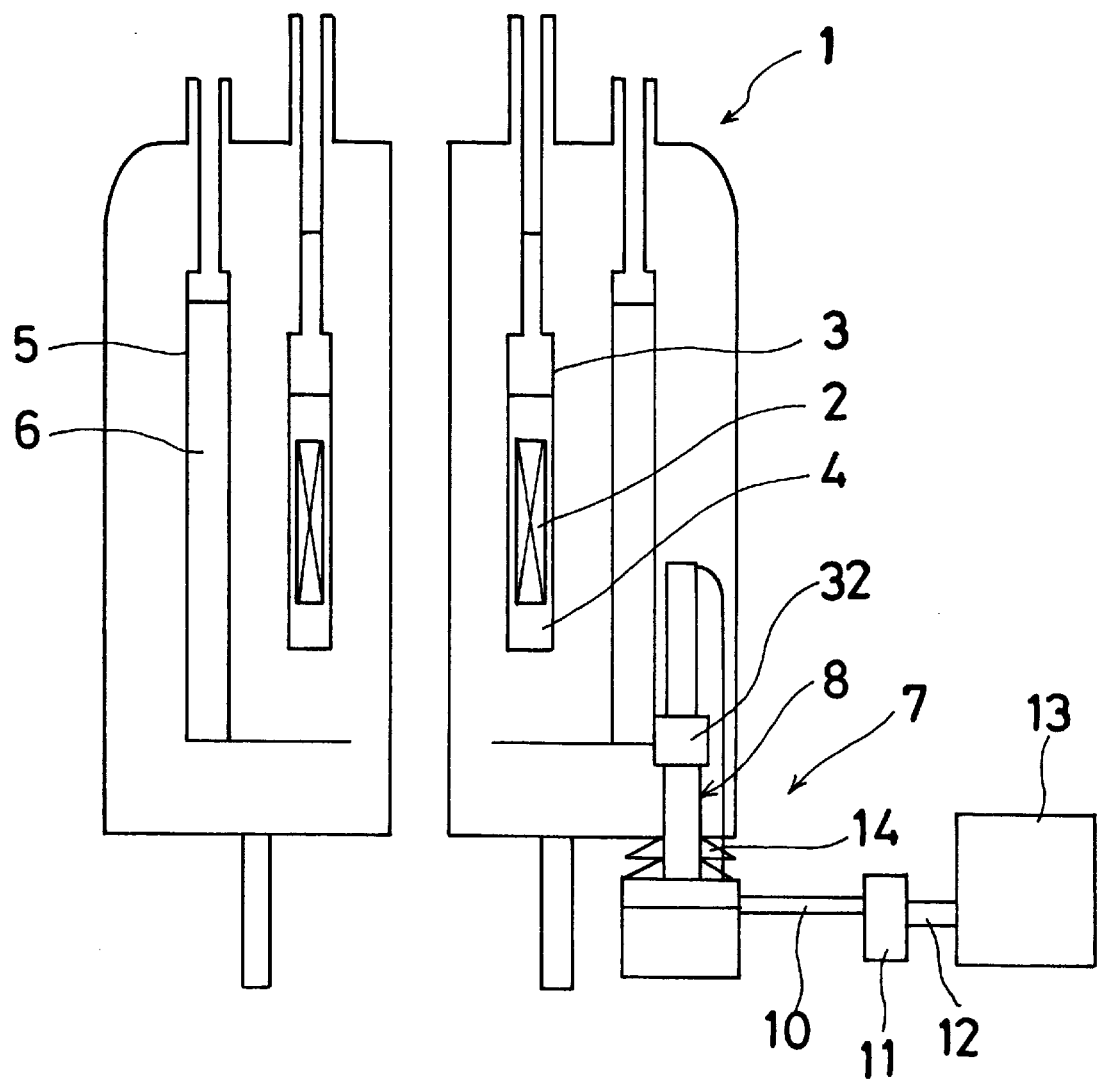
FIG. 2 is a schematic illustration of a superconducting magnet device outfitted with a cooling apparatus according to a second embodiment of the present invention.

FIG. 2 illustrates a second embodiment of the present invention. The second embodiment differs from the first embodiment in that, in the first embodiment, the cold head 32 of the pulse tube refrigerator 7 is directly inserted into the liquid nitrogen storage tank to cool the liquid nitrogen and reduce the evaporation thereof, whereas in the second embodiment the pulse tube refrigerator is not disposed in the liquid nitrogen storage tank but rather in the vacuum insulation vessel to cool the liquid nitrogen storage tank. Portions of the second embodiment which correspond to those of the first embodiment are represented by the same reference numerals, and a detailed description of such features will not be repeated again.

Referring to FIG. 2, the superconducting coil 2 is disposed in the liquid helium storage tank 3 of an NMR apparatus, and thereby cooled to a very low temperature. A liquid nitrogen storage tank 5 is disposed in surrounding relation to the liquid helium storage tank 3 to reduce heat penetration from outside.

A pulse tube refrigerator 7 is comprised primarily of a low temperature generating unit 8, a valve unit 11 communicating with the low temperature generating unit 8 through a flexible pipe 10, and a compressor unit 13 communicating with the valve unit 11 through a flexible pipe 12. The low temperature generating unit 8 is directly connected to the vacuum insulation vessel 1, with a vibration absorbing mechanism 14, such as a bellows, disposed therebetween. The distal end portion of the low temperature generating unit 8 protrudes into the interior of the vacuum insulation vessel 1. A cold head 32 of the low temperature generating unit 8 is in contact with the liquid nitrogen storage tank 5 to ensure adequate and sufficient heat exchange therebetween. In this construction, by operating the pulse tube refrigerator, the cold head 32 is cooled to the liquid nitrogen temperature or lower. As a result, the liquid nitrogen storage tank 5, which is in thermal contact with the cold head 32, is also cooled to the liquid nitrogen temperature or lower, thereby reducing evaporation of the liquid nitrogen 6.

Figure 7:
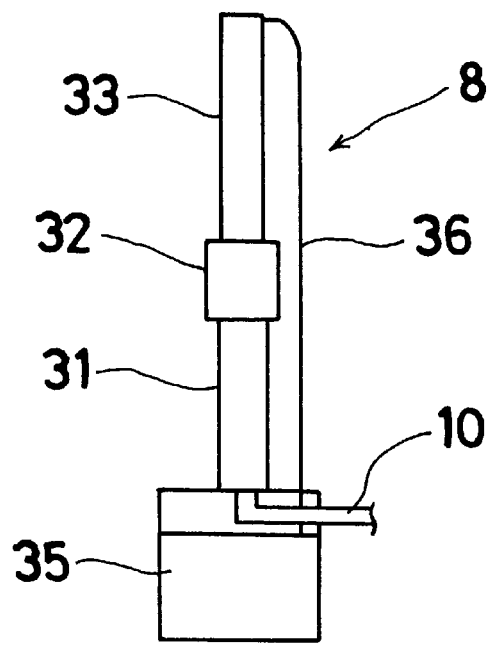
FIG. 7 illustrates a specific construction of a low temperature generating unit of the pulse tube refrigerator used in the second embodiment of the present invention.

A specific construction of the low temperature generating unit 8 used in this second embodiment is shown in FIG. 7. Referring to FIG. 7, the low temperature generating unit 8 is defined by a cold accumulator 31 communicating with an end of the flexible pipe 10, the cold head 32 communicating with an end (lower temperature end) of the cold accumulator 31, a pulse tube 33 communicating at one end thereof with the cold head 32 and at the other end with a conduit 36, and a buffer tank 35 communicating with the conduit 36 through an orifice (not shown). A comparison between FIGS. 6 and 7 reveals that the low temperature generating unit used in the first embodiment is a concentric pulse tube refrigerator, whereas the low temperature generating unit used in the second embodiment is a linear type pulse tube refrigerator. In the linear pulse tube refrigerator used in the second embodiment, the cold accumulator and the pulse tube do not need to have the same length. Thus, the degree of freedom in designing the pulse tube refrigerator is increased as is the degree of freedom in mounting the pulse tube refrigerator to the vacuum insulation vessel 1.

In addition, because the low temperature generating unit 8 of the pulse tube refrigerator 7 is directly connected to the vacuum insulation vessel 1 so that the cold accumulator 31, the cold head 32 and the pulse tube 33 are located in the vacuum insulation vessel, the heat penetration into the low temperature generating unit 8 of the pulse tube refrigerator 7 is reduced, thereby making it possible to make full use of the capacity of the pulse tube refrigerator.

Also, because the cold head 32 is in contact with the liquid nitrogen storage tank 5, the second embodiment of the present invention is able to cool the liquid nitrogen 6 below the boiling point of nitrogen. The amount of heat radiation from outside is proportional to the absolute temperature to the fourth power. Therefore, a further reduction of the liquid nitrogen 6, serving as a heat penetration reducing device, achieved by the construction of this embodiment, correspondingly reduces the temperature difference between the superconducting coil 2 and the liquid nitrogen 6, and therefore further reduces the amount of incoming heat radiation to the superconducting coil 2.

Additionally, because the low temperature generating unit 8 of the pulse tube refrigerator 7 is inserted into the vacuum insulation vessel 1 from the lower portion of the vessel in the FIG. 2 embodiment, the center of gravity of the entire apparatus is lowered, thereby resulting in an apparatus design that is stable against external vibrations.

Further, with the cold head 32 of the pulse tube refrigerator 7 disposed in contact with the liquid nitrogen storage tank 5 to cool the liquid nitrogen storage tank 5 as in this second embodiment, the degree of freedom in connecting the pulse tube refrigerator 7 to the vacuum insulation vessel 1 is increased. For example, the low temperature generating unit 8 of the pulse tube refrigerator 7 can be connected to the lower portion of the vacuum insulation vessel 1 as illustrated in FIG. 2, or may be connected to a side portion of the vacuum insulation vessel 1.

Figure 3:
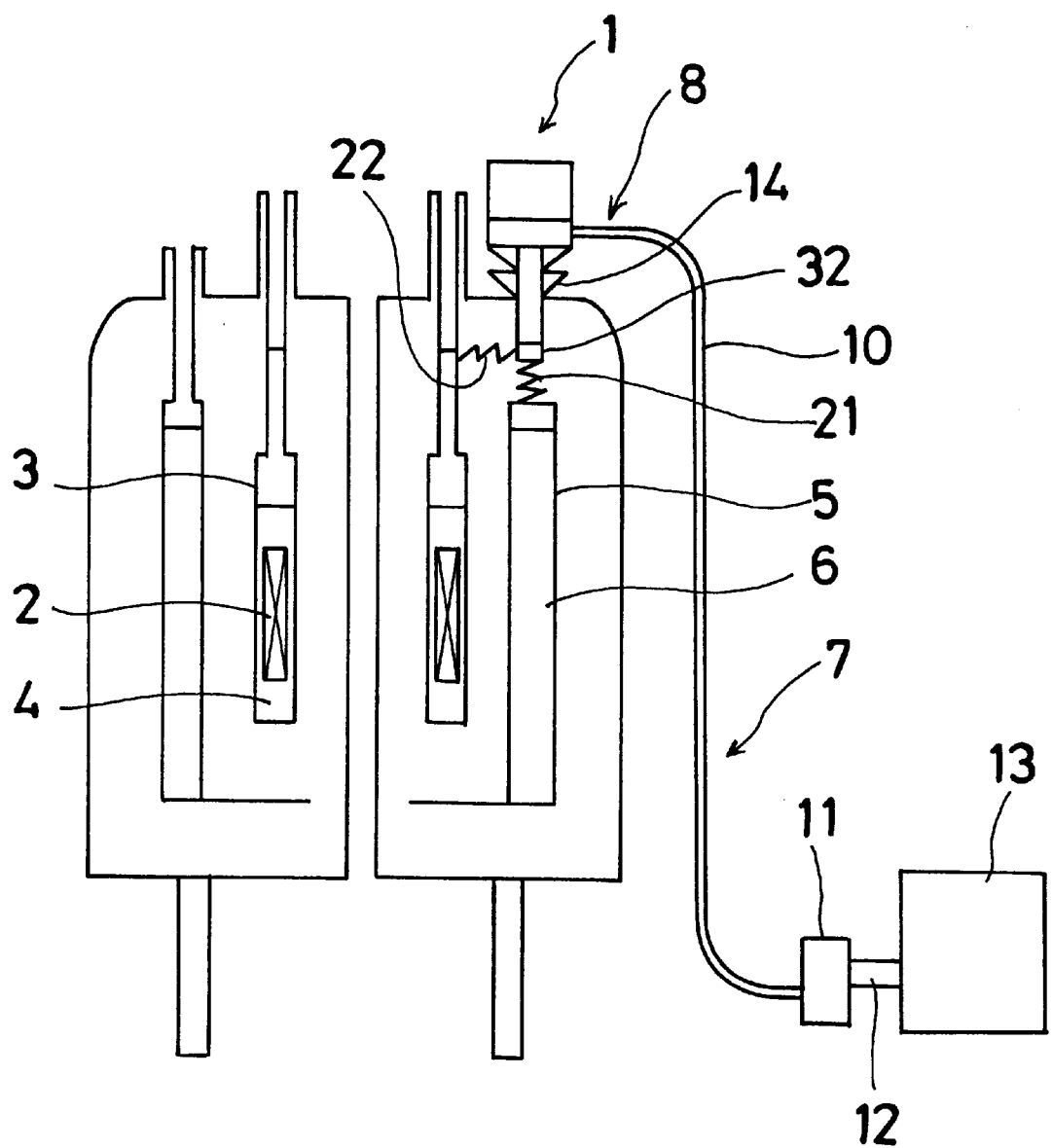
FIG. 3 is a schematic illustration of a superconducting magnet device outfitted with a cooling apparatus according to a third embodiment of the present invention.

A third embodiment of the present invention is shown in FIG. 3. The portions of the third embodiment that correspond to those of the first embodiment are represented by the same reference numerals, and a detailed description of such features will not be included again.

In the third embodiment, a pulse tube refrigerator is used to directly cool both the liquid nitrogen for reducing the heat penetration into a vacuum insulation vessel of a superconducting magnet device, such as an NMR apparatus, and the liquid helium for cooling the superconducting coil. Referring to FIG. 3, in the vacuum insulation vessel 1 of the superconducting magnet device, such as an NMR apparatus, a superconducting coil 2 is disposed in a liquid helium storage tank 3 containing liquid helium so that the coil is cooled to a very low temperature. A liquid nitrogen storage tank 5 containing liquid nitrogen is disposed in surrounding relation to the liquid helium storage tank 3 to reduce heat penetration from the outside.

A pulse tube refrigerator 7 is comprised primarily of a low temperature generating unit 8, a valve unit 11 communicating with the low temperature generating unit 8 through a flexile pipe 10, and a compressor unit 13 communicating with the valve unit 11 through a flexible pipe 12 in a manner similar to that in the first embodiment. The cold head 32 of the low temperature generating unit 8 is thermally connected to both the liquid nitrogen storage tank 5 by a heat conducting member 21 and the liquid helium storage tank 3 by a heat conducting member 22. The heat conducting members 21, 22 may be formed by a flexible copper mesh wire or other similar device. In this construction, when the pulse tube refrigerator 7 is operated, both the liquid helium storage tank 3 and the liquid nitrogen storage tank 5 are cooled to the liquid nitrogen temperature or below.

According to this embodiment, the liquid helium storage tank 3 is cooled to a very low temperature by the pulse tube refrigerator 7, so that the temperature gradient in the liquid helium storage tank 3 decreases and, therefore, the evaporation of the liquid helium is reduced. Further, because the liquid nitrogen storage tank 5 is also cooled by the pulse tube refrigerator 7, evaporation of the nitrogen liquid is further inhibited or reduced.

Figure 4:
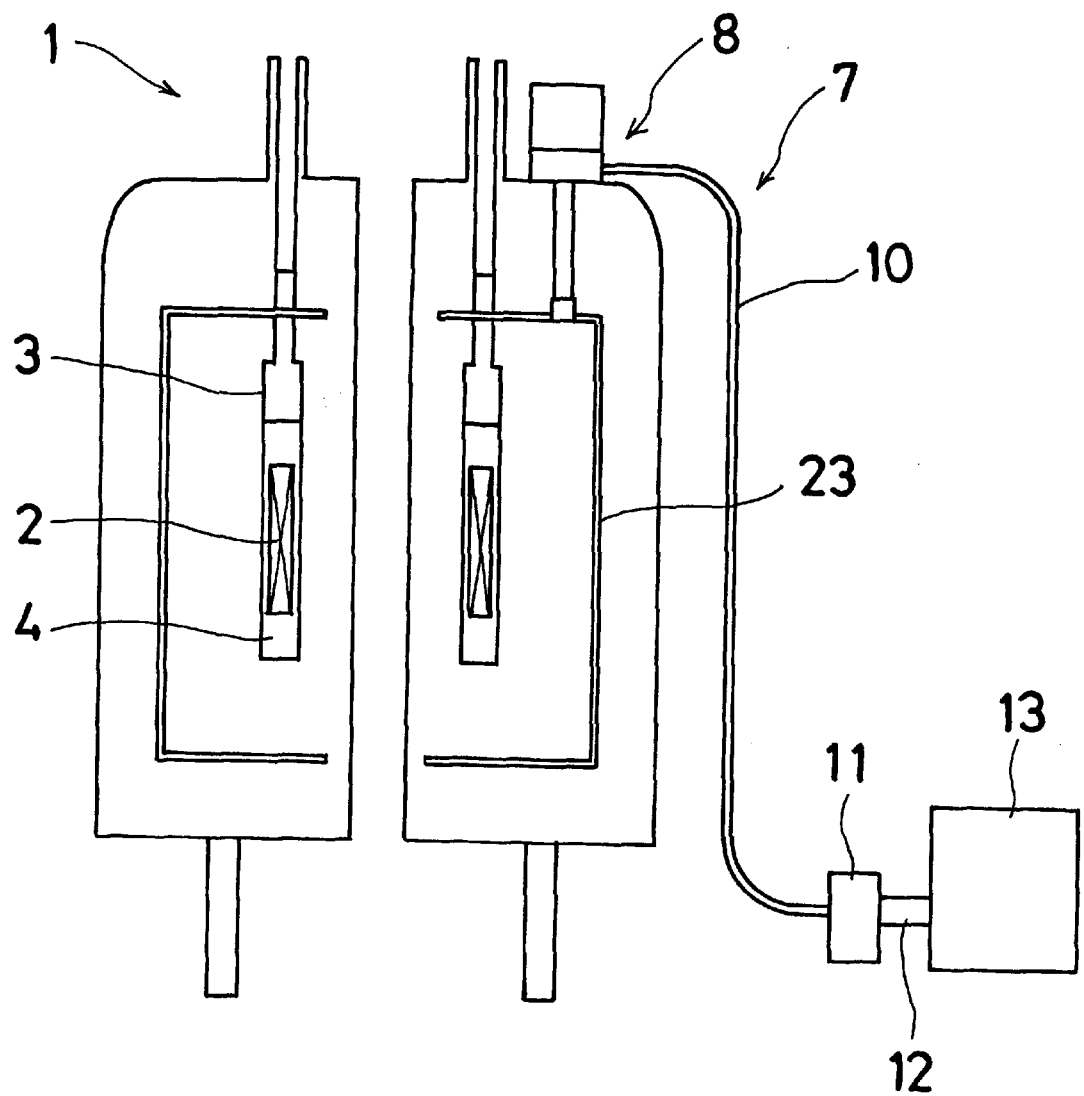
FIG. 4 is a schematic illustration of a superconducting magnet device outfitted with a cooling apparatus according to a fourth embodiment of the present invention.

A fourth embodiment of the present invention will be described with reference to FIG. 4. The portions of the third embodiment that correspond to those of the first embodiment are designated by the same reference numerals and a detailed description of such features will not be repeated again.

In this embodiment, a pulse tube refrigerator is used to cool a radiation shield plate that is designed to reduce heat penetration from outside the vacuum insulation vessel of a superconducting magnet device, such as an NMR apparatus. Referring to FIG. 4, in the superconducting magnet device, such as an NMR apparatus, the superconducting coil 2 is disposed in the liquid helium storage tank 3 and is thereby cooled to a very low temperature. A radiation heat shield plate 23 is disposed in surrounding relation to the liquid helium storage tank 3.

The pulse tube refrigerator 7 is comprised primarily of a low temperature generating unit 8, a valve unit 11 communicating with the low temperature generating unit 8 through a flexible pipe 10, and a compressor unit 13 communicating with the valve unit 11 through a flexible pipe 12 in a manner similar to that in the first embodiment. The cold head 32 of the low temperature generating unit 8 is in contact with the radiation shield plate 23. In this construction, when the pulse tube refrigerator 7 is operated, the cold head 32 is cooled and the radiation shield plate 23 in contact with the cold head 32 is also cooled. This blocks or prevents heat penetration from the outside. This embodiment, like the other embodiments, is advantageous in that it allows a compact construction of the entire apparatus. Further, because the liquid nitrogen storage tank 5 is omitted by employing the radiation shield plate 23 instead, this embodiment eliminates the potentially troublesome operation associated with replenishing the liquid nitrogen.

Figure 5:
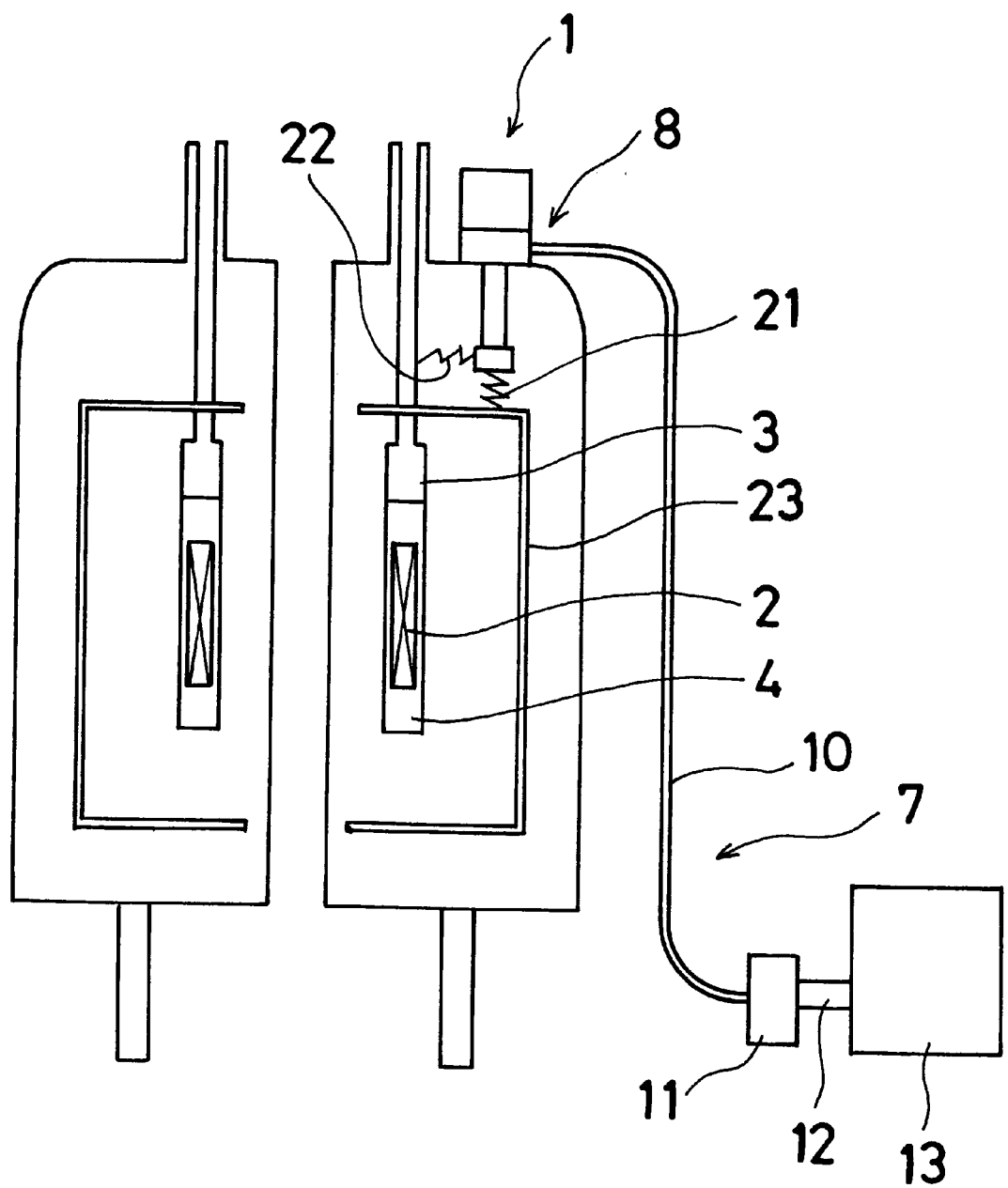
FIG. 5 is a schematic illustration of a superconducting magnet device outfitted with a cooling apparatus according to a fifth embodiment of the present invention.

A fifth embodiment will be described with reference to FIG. 5. This fifth embodiment is based on the construction of the fourth embodiment and is designed so that the cold head 32 of the pulse tube refrigerator 7 is connected to both the liquid helium storage tank 3 containing liquid helium and the radiation shield plate 23 that reduces heat penetration from outside to the liquid helium storage tank 3. The connection of the cold head 32 to the liquid helium storage tank 3 is effected by a flexible heat conducting member 21 while the connection of the cold head 32 to the shield plate 23 is effected by a flexible heat conducting member 22. In this way, both the liquid helium storage tank 3 and the radiation shield plate 23 are cooled. The other parts of the overall apparatus are substantially the same as in the fourth embodiment, and will not be described again.

The fifth embodiment is quite advantageous in that it allows a very long interval between liquid helium replenishments, in addition to eliminating the troublesome operation of replenishing liquid nitrogen.

In the third and fifth embodiments, the liquid nitrogen directly cooling the superconducting coil is also cooled by the pulse tube refrigerator. As can be appreciated from these embodiments, it is possible to omit a device for reducing heat penetration from outside, such as liquid nitrogen or a radiation shield plate, if the refrigerating capacity of the pulse tube refrigerator is improved so that the cold head achieves a refrigeration temperature comparable to the liquid helium temperature. Such a pulse tube refrigerator capable of achieving a refrigeration temperature comparable to the liquid helium temperature may be a two-stage pulse tube refrigerator or other similar devices. Furthermore, a superconducting coil can also be brought to a superconducting state by directly cooling it using an ordinary single-stage pulse tube refrigerator, if the superconducting coil is a superconducting coil that has a relatively high superconduction transition temperature, that is a superconductor generally referred to as a high-temperature superconductor. Further, a high-temperature superconducting coil can be brought to a superconducting state using liquid nitrogen. In this case, a single-stage pulse tube refrigerator can be used to cool the liquid nitrogen and reduce the evaporation thereof. In the aforementioned cases, it is also possible to omit the heat penetration reducing device, such as the radiation shield plate, liquid nitrogen or the like. The superconducting coil that can be used in such a construction may be formed from, for example, a Y—Ba—Cu—O—based high-temperature superconducting ceramic or the like. Such a superconducting ceramic can be formed into a coil shape by mixing silver or the like into the ceramic so as to make it plastically deformable.

Figure 8:
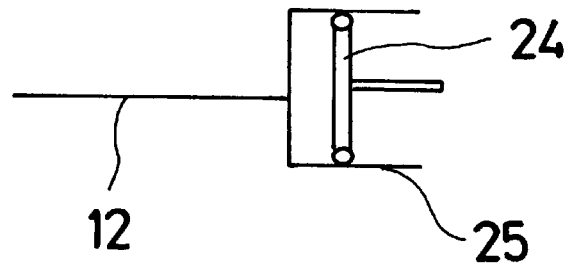
FIG. 8 illustrates another form of the pressure oscillation generating source.
Figure 9:
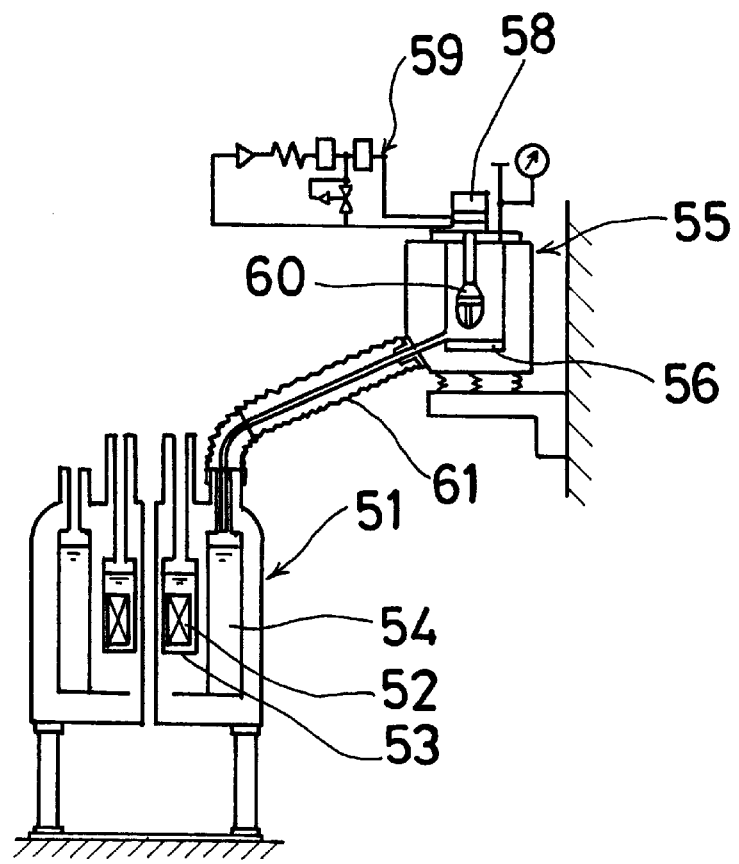
FIG. 9 is a schematic diagram of a conventional cooling apparatus for a superconducting magnet device.

Although, in the foregoing embodiments, the pressure oscillation generating source of the pulse tube refrigerator is formed by the valve unit and the compressor unit, the pressure oscillation generating source may also be formed, as shown in FIG. 8, primarily by a piston 24 and a cylinder 25, wherein pressure oscillations are generated by reciprocating movement of the piston 24 in the cylinder 25.

As is apparent from the foregoing detailed description, because the low-vibration pulse tube refrigerator is employed as a refrigerator for the superconducting magnet device such as an NMR apparatus, the present invention makes it possible to reduce vibrations transmitted to the superconducting magnet device and therefore enables high-precision measurement by the device. In addition, because the need to provide a reliquefaction device outside the superconducting magnet device is eliminated, the present invention permits realization of a compact construction for the overall apparatus.

Thus, the present invention advantageously utilizes a low-vibration pulse tube refrigerator for the direct or indirect cooling of the superconducting magnet or a superconducting magnet device, such as an NMR apparatus, or for the cooling of a heat penetration reducing device or liquid and the reduction of evaporation of such liquid.

The principles, preferred embodiments and modes of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A superconducting magnet system comprising a vacuum insulation vessel, a superconducting magnet disposed in the vacuum insulation vessel, cooling means for cooling the superconducting magnet, and a pulse tube refrigerator that includes a pressure oscillation generating source and a low temperature generating unit, said low temperature generating unit being connected to the vacuum insulation vessel, the low temperature generating unit having a cold head that generates cold for facilitating cooling of the cooling means.

2. A superconducting magnet system according to claim 1, wherein the pressure oscillation generating source and the low temperature generating unit are spaced apart from one another and are connected to one another by a connecting pipe.

3. A superconducting magnet system according to claim 1, wherein the low temperature generating unit is connected to the vacuum insulation vessel by a vibration reducing element.

4. A superconducting magnet system according to claim 1, wherein the cooling means includes liquid helium disposed in a liquid helium storage tank, and including liquid nitrogen disposed in a liquid nitrogen storage tank, the liquid nitrogen storage tank surrounding the liquid helium storage tank.

5. A superconducting magnet system according to claim 4, wherein the cold head extends into the liquid nitrogen storage tank.

6. A superconducting magnet system according to claim 4, wherein the cold head is in contact with the liquid helium storage tank.

7. A superconducting magnet system according to claim 4, wherein the cold head is thermally connected to the liquid nitrogen storage tank and is thermally connected to the liquid helium storage tank.

8. A superconducting magnet system comprising a vacuum insulation vessel, a superconducting magnet disposed in the vacuum insulation vessel, cooling means for cooling the superconducting magnet, a heat penetration reducing device for reducing heat penetration from outside the vacuum insulation vessel, and a pulse tube refrigerator that includes a pressure oscillation generating source and a low temperature generating unit, said low temperature generating unit being connected to the vacuum insulation vessel, the low temperature generating unit having a cold head that generates cold for cooling the heat penetration reducing device.

9. A superconducting magnet system according to claim 8, wherein the pressure oscillation generating source and the low temperature generating unit are spaced apart from one another and are connected to one another by a connecting pipe.

10. A superconducting magnet system according to claim 8, wherein the low temperature generating unit is connected to the vacuum insulation vessel by a vibration reducing element.

11. A superconducting magnet system according to claim 8, wherein the cooling means includes liquid helium disposed in a liquid helium storage tank, said cold head being in contact with the liquid helium storage tank by a first heat conducting member and being in contact with the heat penetration reducing means by a second heat conducting member.

12. A superconducting magnet system according to claim 8, wherein the heat penetration reducing means is a heat shield plate, and the cold head is in contact with the heat shield plate by way of a heat conducting member.

13. A superconducting magnet system according to claim 8, wherein the heat penetration reducing means is a liquid coolant contained in a liquid storage tank, said cold head protruding into the liquid storage tank.

14. A superconducting magnet system comprising a vacuum insulation vessel, a superconducting magnet disposed in the vacuum insulation vessel, a pulse tube refrigerator having a pressure oscillation generating source and a low temperature generating unit, the low temperature generating unit being mounted on and connected to the vacuum insulation vessel, the low temperature generating unit having a cold head that generates cold for facilitating cooling of the superconducting magnet.

15. A superconducting magnet system according to claim 14, including a liquid storage tank containing cooling liquid, the cold head being in contact with the liquid storage tank.

16. A superconducting magnet system according to claim 14, including a liquid storage tank containing a cooling liquid, the cold head being disposed in the liquid storage tank.

17. A superconducting magnet system according to claim 14, wherein the pressure oscillation generating source and the low temperature generating unit are spaced apart from one another and are connected to one another by a connecting pipe.

18. A superconducting magnet system according to claim 14, wherein the low temperature generating unit is connected to the vacuum insulation vessel by a vibration reducing element.

* * * * *

UNITED STATES PATENT AND TRADEMARK OFFICE
CERTIFICATE OF CORRECTION

PATENT NO. : 5,966,944
DATED : October 19, 1999
INVENTOR(S) : Tatsuo INOUE et al It is certified that error appears in the above-identified patent and that said Letters Patent is hereby corrected as shown below:

On the title page add:

— [30] Foreign Application Priority Data
April 9, 1997 [JP]   Japan ..................... 9-91096 —

Signed and Sealed this

Nineteenth Day of September, 2000

Attest:

Q. TODD DICKINSON

*Attesting Officer*   *Director of Patents and Trademarks*